US009484884B2

(12) United States Patent
Le Traon et al.

(10) Patent No.: US 9,484,884 B2
(45) Date of Patent: Nov. 1, 2016

(54) PLANAR STRUCTURE OF A MECHANICAL RESONATOR DECOUPLED BY BENDING OSCILLATION AND EXPANSION/COMPRESSION VIBRATIONS

(71) Applicant: Office National D'Etudes et de Recherches Aerospatiales (ONERA), Chatillon (FR)

(72) Inventors: Olivier Le Traon, Vauhallan (FR); Denis Janiaud, Les Ulis (FR); Rachid Taibi, Bures-sur-Yvette (FR); Claude Chartier, Massy (FR); Vincent Gaudineau, Palaiseau (FR); Marc Pernice, Fresnes (FR)

(73) Assignee: Office National D'Etudes Et De Recherches Aerospatials, Chatillon (FR)

( * ) Notice: Subject to any disclaimer, the term of this patent is extended or adjusted under 35 U.S.C. 154(b) by 0 days.

(21) Appl. No.: 14/767,082

(22) PCT Filed: Feb. 13, 2014

(86) PCT No.: PCT/FR2014/000037
§ 371 (c)(1),
(2) Date: Aug. 11, 2015

(87) PCT Pub. No.: WO2014/125178
PCT Pub. Date: Aug. 21, 2014

(65) Prior Publication Data
US 2016/0006412 A1    Jan. 7, 2016

(30) Foreign Application Priority Data

Feb. 14, 2013 (FR) .................................. 13 00322

(51) Int. Cl.
| | |
|---|---|
| H03H 9/205 | (2006.01) |
| H03H 9/17 | (2006.01) |
| H03H 9/24 | (2006.01) |
| H03H 9/02 | (2006.01) |
| H03H 9/15 | (2006.01) |

(52) U.S. Cl.
CPC ........... *H03H 9/17* (2013.01); *H03H 9/02062* (2013.01); *H03H 9/02157* (2013.01);
(Continued)

(58) Field of Classification Search
CPC ..................... H03H 9/02023; H03H 9/02062; H03H 9/02157; H03H 9/02244; H03H 9/02338; H03H 9/02433; H03H 9/17; H03H 9/2015; H03H 9/215; H03H 9/2447; H03H 2009/02251; H03H 2009/02291; H03H 2009/0244; H03H 2009/02496; H03H 2009/02527; H03H 2009/155
USPC .................................................. 333/186, 197
See application file for complete search history.

(56) References Cited

U.S. PATENT DOCUMENTS

| | | |
|---|---|---|
| 4,350,918 A | 9/1982 | Sato |
| 5,627,425 A | 5/1997 | Kaida et al. |

(Continued)

OTHER PUBLICATIONS

S. Lee et al.; "Mechanically-Coupled Micromechanical Resonator Arrays for Improved Phase Noise"; 2004 IEEE International Ultrasonics, Ferroelectrics, and Frequency Control Joint 50th Anniversary Conference, 2004, pp. 144-150.*

(Continued)

*Primary Examiner* — Barbara Summons
(74) *Attorney, Agent, or Firm* — Dority & Manning, P.A.

(57) ABSTRACT

Mechanical resonators for making timepieces have the drawback of not being simultaneously efficient, compact, and inexpensive. The invention is a planar structure of a mechanical resonator (100) that is suitable for reducing bulkiness and manufacturing cost and comprises a bar (R) vibrating in longitudinal expansion/compression resonance and two beams, (12) each vibrating simultaneously in longitudinal expansion/compression and it bending oscillation in the plane of the structure and connected to the bar by a connection element (11) on the median plane (π) of the bar, thereby enabling the effects of the transverse deformations of the bar, due to the Poisson ratio of the material, to not be transmitted to the attachment pads (PF) of the resonator. Thus, the quality factor of the resonator can be very high.

6 Claims, 5 Drawing Sheets

(52) U.S. Cl.
CPC ........ *H03H 9/02338* (2013.01); *H03H 9/205* (2013.01); *H03H 9/2447* (2013.01); *H03H 9/02023* (2013.01); *H03H 2009/0244* (2013.01); *H03H 2009/02251* (2013.01); *H03H 2009/02291* (2013.01); *H03H 2009/02496* (2013.01); *H03H 2009/02527* (2013.01); *H03H 2009/155* (2013.01)

(56) References Cited

U.S. PATENT DOCUMENTS

| | | | |
|---|---|---|---|
| 7,323,952 B2 * | 1/2008 | Pan | H03H 3/0077 333/186 |
| 8,476,990 B2 * | 7/2013 | Winkler | G04C 3/12 257/415 |
| 2016/0006412 A1 * | 1/2016 | Le Traon | H03H 9/02157 333/133 |

OTHER PUBLICATIONS

Yokoyama et al., "Design and Fabrication of a Length-Extension Mode Rectangular X-Cut Quartz Resonator with Zero Temperature Coefficient," IEEE Transactions on Ultrasonics, Ferroelectrics, and Frequency Control, vol. 53, No. 5, May 2006, pp. 847-852.

Le Traon et al., "The Fairy World of Quartz Vibrating EMS," *IEEE*, 2012, pp. 214-220.

International Search Report for PCT/FR2014/000037 dated Jun. 18, 2014, 4 pages.

* cited by examiner

PLANAR STRUCTURE OF A MECHANICAL RESONATOR DECOUPLED BY BENDING OSCILLATION AND EXPANSION/COMPRESSION VIBRATIONS

CROSS REFERENCE TO RELATED APPLICATION

This application is the national stage entry of International Patent Application No. PCT/FR2014/000037 having a filing date of Feb. 13, 2014, which claims priority to and the benefit of French Patent No. 1300322 filed in the French Intellectual Property Office on Feb. 14, 2013, the entire contents of which are incorporated herein by reference.

FIELD OF THE INVENTION

The technical field of the invention is that of the mechanical resonators that make it possible to produce time or frequency measuring instruments. More particularly, the invention relates to a mechanical resonator with a high figure of merit intended for example for high-stability clocks, called "ultra-stable oscillators" (USO).

The technical problem to be solved is how to reduce the bulk and the cost of production of the resonator.

BACKGROUND

Before describing the prior art, it is useful to specify hereinbelow the concept of figure of merit of a mechanical resonator.

In a USO, the mechanical resonator is associated with an oscillating electronic loop which makes it possible to maintain the vibration of the resonator at its mechanical resonance frequency. Thus, the stability of the frequency of the alternating electrical signal present in the electronic loop benefits from the stability of the frequency of the mechanical resonance of the resonator, generally much greater than that of a purely electronic oscillating loop.

The stability of the resonance frequency the mechanical resonator is all the greater when the figure of merit of the resonance vibration is high, in other words the vibration energy contained in the resonator is great compared to the energy lost per period of the vibration. There are two types of energy losses, on the one hand the intrinsic losses due for example to the viscous damping of the material forming the resonator, on the other hand the extrinsic losses due for example to a gaseous damping or to an inappropriate fixing of the resonator. This is why the best resonators are produced in materials with very low viscous damping such as quartz, why they are vacuum-packaged in a package, and why they are fixed in this package in the u position of what has come to be called ideally a vibration node.

There is a practical formulation for expressing the contribution of the different sources of energy losses, as is explained hereinbelow.

The expression of the real figure of merit of the resonator is written:

$Q$ real=$2\pi \cdot E/\Delta E$

Where E is the energy contained in the resonator and $\Delta E$ the energy lost per period of the vibration. For the examples cited previously, $\Delta E$ can be written:

$\Delta E = \Delta E$ intrinsic+$\Delta E$ gas+$\Delta E$ fixing

It is therefore possible to write:

$1/Q$ real=($\Delta E$ intrinsic+$\Delta E$ gas+$\Delta E$ fixing)/$2\pi \cdot E$ Or:

$1/Q$ real=$\Delta E$ intrinsic/$2\pi \cdot E$+$\Delta E$ gas/$2\pi \cdot E$+$\Delta E$ fixing/$2\pi \cdot E$ Thus, it is possible to associate with each source of energy losses a figure of merit which is specific to it, and write:

$1/Q$ real=$1/Q$ intrinsic+$1/Q$ gas+$1/Q$ fixing

For the real figure of merit of the resonator to be close to its intrinsic figure of merit, it is therefore essential for the figures of merit associated with the various extrinsic sources of losses to be very much greater than the intrinsic figure of merit. By way of example, if Q intrinsic is of the order of $10^6$, it is desirable for Q fixing and Q gas to he of the order of at least $10^7$.

The invention relates to the losses due to the fixing of the resonator, and aims to obtain Q fixing very much greater than Q intrinsic, while benefiting from a very small bulk and a very low production cost.

The closest prior art combines the following two approaches. For the first approach, as for the invention, the vibration of the resonator is an expansion-compression mode. For the second approach, the vibration of the resonator is a contour mode, which means that the structure of the vibrating part of the resonator is planar and that the vibrations take place primarily parallel to its plane; there can be, for example, expansion-compression or shearing vibrations or bending oscillations.

Figure 1A:
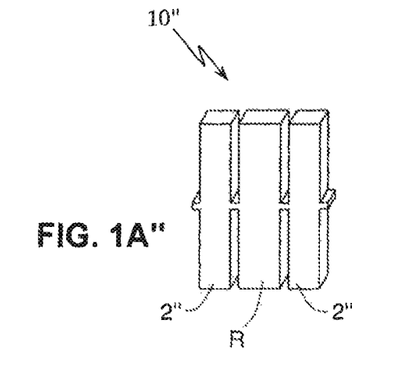
FIG. 1A is intended to explain the operation of the vibrating core of a resonator according to the prior art and already described.
Figures 1A, 1B:
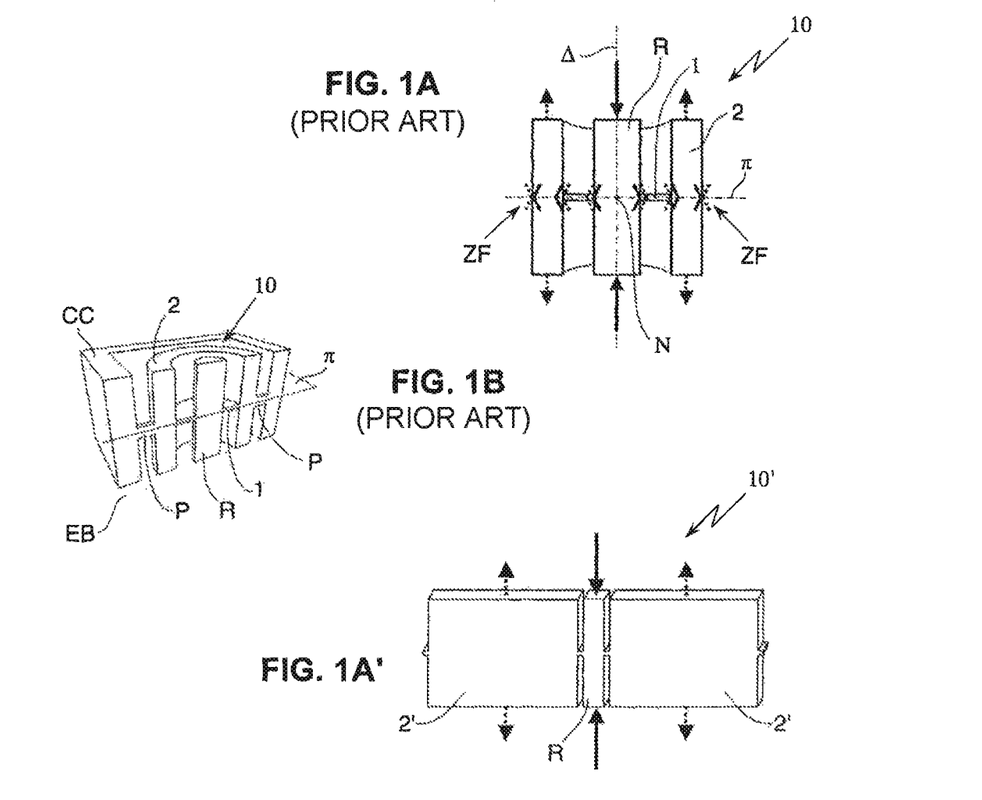
FIG. 1B is a perspective view in longitudinal cross section of said resonator according to the prior art and already described.

The first approach (patent application No. FR 2 962 614 published on 13 Jan. 2012 in the name of the applicant) is illustrated in FIG. 1A intended to explain the operation of the vibrating core 10 of the resonator, and in FIG. 1B which shows a perspective view in longitudinal cross section of the resonator comprising the vibrating core 10 and a hollow straight cylinder CC of square directrices surrounding the vibrating core 10 and intended to be assembled on a package base EB.

Referring to FIG. 1A, the vibrating core 10 of the resonator comprises a solid straight cylinder R, a hollow straight cylinder 2 of the same height surrounding the solid straight cylinder, and a membrane 1 positioned in the median plane π and secured to the cylindrical surface of the solid cylinder and to the internal cylindrical surface of the hollow cylinder.

The solid cylinder R vibrates according to a longitudinal expansion-compression resonance mode and has a vibration node N situated in the median plane π, and the hollow cylinder 2 vibrates also in longitudinal expansion-compression resonance mode, at the same frequency as the solid cylinder, but in phase opposition with the vibration of the solid cylinder. The identity of the resonance frequencies of the two cylinders stems from the identity of their heights, which is a condition necessary to the operation of the resonator (see page 9, line 37 to page 10, line 11 of the abovementioned patent). The vibrations in phase opposition of the two cylinders correspond to a particular mechanical resonance mode of the vibrating core 10, that is to say a spontaneous mode.

The weight of the hollow cylinder 2 is very much greater than the weight of the solid cylinder R, because the thickness of the wall of the hollow cylinder is of the order of magnitude of the diameter of the solid cylinder (see page 12, line 2 to line 9). This geometrical condition in fact means that the weight of the hollow cylinder 2 is of the order of 10 times the weight of the solid cylinder R.

It follows therefrom that the vibration amplitude of the hollow cylinder is very much less than that of the solid cylinder, in order for the quantities of movement involved in said particular resonance mode to balance naturally (see page 10 line 14 to line 22). This makes it possible for the effects of the radial deformations (Poisson effects) of the two cylinders to be neutralized in a zone ZF situated on the outer surface of the hollow cylinder in the vicinity of the median plane π.

Thus, the zone ZF can be practically decoupled from the vibration of the resonator, which makes it possible, as shown in FIG. 1B, to hold the hollow cylinder 2 by means of bridges P secured to a hollow cylinder CC without affecting the intrinsic figure of merit of the resonator. The operation of this resonator known from the prior art is thus very satisfactory.

The teaching of the first approach is moreover complemented in the article entitled "A Micro-Resonator for Fundamental Physics Experiments and its Possible Interest for Time and Frequency Applicaitons" by Olivier Le Traon (European Frequency and Time Forum, 2011) which indicates that the expansion-compression of the hollow cylinder is accompanied by a bending of its wail (FIG. 4 of the article and last line of section II), thus demonstrating that the real behavior of the vibrating core of the resonator is a little more complex than the basic principle presented in the abovementioned patent.

The drawbacks of this first approach lie firstly in the bulk of the resonator due to its three-dimensional structure that is ill suited to the techniques of integration of microsystems whose structures are generally planar; secondly, the correct operation of the resonator is demanding with respect to the symmetry of the resonator relative to the median plane π, particularly with respect to the position of the membrane 1 obtained by controlling the depth of the machining performed parallel to the longitudinal axis Δ of the resonator which weighs on the production cost.

It could appear interesting to take a lead from this first approach by trying to make a planar vibrating core structure operate on a mode similar to that described in the first approach, as illustrated in FIG. 1A' which shows said planar structure referenced 10' comprising a bar R and two beams 2' positioned on either side of the bar.

In order to comply with the conditions recommended. by the abovementioned patent, the beams 2' should have the same height as that of the bar and a weight very much greater than that of the bar, which would mean, for the beams 2', a very large dimension taken in the plane of the structure at right angles to their height dimension, as is illustrated in FIG. 1A'.

Thus, this novel approach, although benefiting from the advantage of a planar structure, would present, as for the first approach, the drawback of a significant bulk.

It might also appear interesting to take a lead only from FIG. 1A of the first approach, without complying with the recommended condition of a weight ratio between the beams and the bar. This would lead to trying to make a planar vibrating core structure 10" like that illustrated in FIG. 1A" operate. A study performed by means of numerical simulations (finite elements) shows that, generally, this novel approach does not work. As illustrated in FIG. 1A''', each of the beams 2" vibrates in expansion-compression resonance in phase opposition with the expansion-compression resonance of the bar R, but the Poisson effects of the beams do not neutralize those of the bar. More specifically, the Poisson effects of the beams have amplitudes close to those of the Poisson effects of the bar, but are of a direction opposite to the Poisson effects of the bar; in other words, the Poisson effects of the beams "accompany" the Poisson effects of the bar. Because of this, the longitudinal central axis δ of each of the beams remains practically immobile during the vibration. In these conditions, the symmetry of each of the beams and of its vibration leads, in the same way as for the bar, to the existence of a vibration node n situated at the center of the beam, that is to say at the core of the material. Because of this, the vibrating core does not exhibit any zone that makes it possible to hold it without affecting the intrinsic figure of merit of the resonator.

The second approach of the closest prior art is shown in the U.S. Pat. No. 4,350,918 published on 21 Sep. 1982 in the name of Kabushiki Kaisha Daini Seikosha and illustrated in FIGS. 2A, 2B and 2C and 2D (FIGS. 8, 9, 10b and 10c of the patent).

Figure 2A:
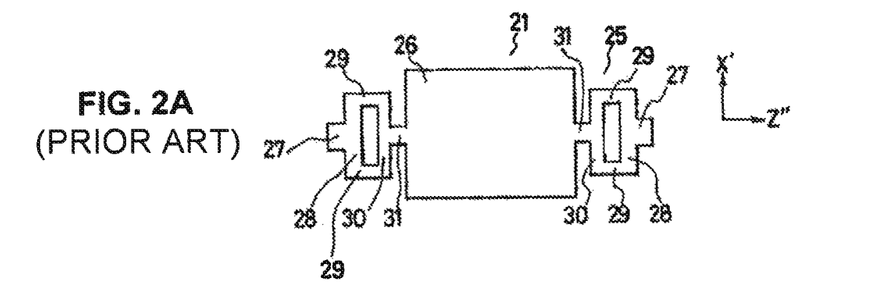
FIGS. 2A and 2B are front views of another resonator according to the prior art and already described.

FIG. 2A shows a front view of a piezoelectric resonator 21 with contour vibration mode comprising a vibrating portion 26 and at least one support portion 25 forming a piece with the vibrating portion by means of a bridge part 31. The resonator 21 is characterized. in that each support portion 25 consists of an elastic part 30 interconnected with said vibrating portion 26, an attenuation part 28 made of a piece with said elastic part 30 and with only minimal displacement and a fixing part 27 intended to be fixed to a support piece.

The attenuation part 28 is connected by its two ends to the elastic part 30 via connection parts 29, thus forming an opening in the support portion 25.

Figure 2B:
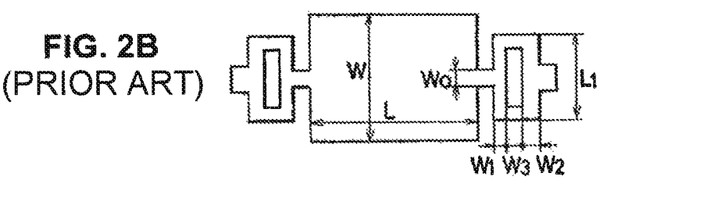

The width of the bridge part 31, the width of the elastic part 30, the width of the attenuation part 28, the distance between the elastic part and the attenuation part, and the length of the elastic part are respectively W0, W1, W2, W3 and L1, as shown in FIG. 2B.

These dimensions play an important role in the operation of this resonator, particularly in the decoupling of the vibrations, of the vibrating portion with respect to the fixing part 27. When these dimensions satisfy a certain number of relationships specified in the abovementioned patent, then the decoupling can be excellent as illustrated in FIGS. 2C and 2D which show only a quarter of FIG. 2A taking account of the symmetry.

Figure 2C:
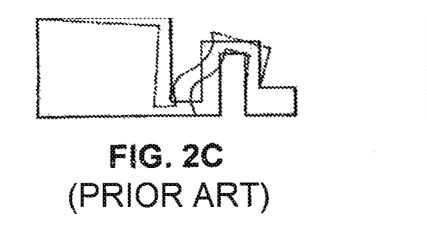
FIGS. 2C and 2D show, on only a quarter of the resonator of FIG. 2A, deformations of the resonator vibrating on two contour modes respectively and already described.
Figure 2D:
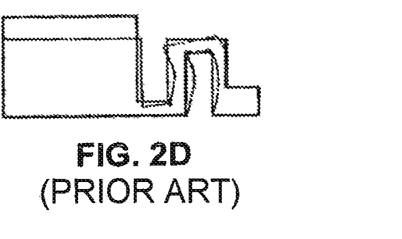

FIGS. 2C and 2D show by dotted lines exaggeratedly enlarged deformations of the resonator vibrating on two contour modes respectively. It is specified that the resonator is designed to operate simultaneously on these two modes deliberately coupled together, which is obtained by observing certain dimensional ratios between the short side W and the long side L of the vibrating portion 26; this makes it possible to obtain an excellent frequency/temperature characteristic of the resonator.

To obtain the decoupling of the vibrations of the vibrating portion 26 with respect to the fixing part 27, it is therefore necessary for each of the two contour modes illustrated in FIGS. 2C and 2D to be decoupled from said fixing part. This is what is obtained by means of this second approach, because the displacement of the fixing part 27 is minimal for the two modes.

The teaching of the second approach is moreover complemented in the article entitled "Design and Fabrication of Length-Extensional Mode Rectangular X-Cut Quartz Resonator with Zero Temperature Coefficient" by Yukio Yokoyama (IEEE Transactions on Ultrasonics, Ferroelectrics, and Frequency Control, vol. 53, No. 5, May 2006) which presents a resonator suitable for vibrating according to a longitudinal expansion-compression mode and illustrated in FIG. 2A' (FIG. 9 of the article).

Although the article is very inexplicit on the operation of this resonator (a few lines at the end of the conclusion), a person skilled in the art can recognize the device of the second approach illustrated in FIG. 2A, and understand that the author of the article has adapted the second approach to the particular case of a resonator vibrating on a single contour mode, in this case the longitudinal expansion-compression mode.

The planar structures of the resonators of the second approach and their exclusively open-ended machinings are well suited to the microsystems integration techniques.

However, the drawback of this second approach relates to the difficulty in producing the resonator with sufficient accuracy to ensure correct operation, notably in the support portions 25 and more specifically with respect to the widths W1 and W2 of the elastic part and of the attenuation part respectively, as well as the distance W3 between the elastic part and the attenuation part. This production difficulty, all the greater when the dimensions of the resonator are small, is reflected either by a brake to the miniaturization of the resonator, or by a relatively high production cost.

The aim of the invention is notably to overcome the drawbacks of the earlier approaches by proposing a mechanical resonator whose operation is as satisfactory as that obtained by the first and second approaches, but whose structure is better suited to reducing the bulk and the cost of the resonator.

To obtain a good understanding of the elements characterizing the invention, it is useful to recall that the slenderness ratio of a parallelepipedal beam, taken in a plane borne by its length dimension L and one of its two section dimensions c, is defined by the ratio L/c.

SUMMARY OF THE INVENTION

In order to overcome the drawbacks of the earlier approaches, the planar mechanical resonator structure comprising a bar vibrating according to an expansion-compression resonance mode along its longitudinal central axis and having a vibration node in its median plane at right angles to said longitudinal central axis, the vibration naturally inducing transverse expansion-compression deformations, is characterized in that the structure comprises two parallelepipedal beams that are substantially identical to one another, each symmetrical relative to said median plane and positioned respectively on either side of the bar, the longitudinal axes of the beams being parallel to said longitudinal central axis, the length of the beams being substantially equal to that of the bar and the slenderness ratio of the beams taken in the plane of the structure being substantially equal to the result of the addition of six and a half and a number equivalent to twenty-eight percent of the slenderness ratio of the bar taken in the plane of the structure, and two link elements positioned respectively on either side of the bar in the vicinity of said median plane and each linking a face of the bar to a face of a beam, by virtue of which the beams, excited at the link elements by said transverse expansion-compression deformations of the bar, each vibrate simultaneously according to two modes, the first mode being a longitudinal expansion-compression mode in phase opposition with the vibration of the bar, the second mode being a bending mode taking place parallel to the plane of the structure, and the effects of the transverse deformations of the bar and of each of the beams are neutralized in a zone situated on the face of the beam opposite the face secured to the link element and in the vicinity of said median plane.

The simultaneous vibrations of the her in longitudinal expansion-compression resonance mode and of the beams according to said first and second modes correspond to a particular mechanical resonance mode of the resonator structure according to the invention, for which the vibrating can be spontaneously obtained by exciting the bar in longitudinal expansion-compression resonance mode.

The two dimensional relationships indicated above between the beams and the bar are necessary to the correct operation of the resonator according to the invention, because, firstly, they allow for the coexistence of said first and second vibration modes of the beams: the first relationship (length of the beams substantially equal to that of the bar) relates to the first mode and makes it possible to have the beams work substantially at their resonance frequency in longitudinal expansion-compression; in addition to the first relationship, second relationship (slenderness ratio of the beams substantially equal to the result of the addition of six and a half and a number equivalent to twenty-eight percent of the slenderness ratio of the bar) relates to the second mode and makes it possible to have the beams work in the vicinity of their bending resonance frequency.

Secondly, the two dimensional relationships condition the distribution of the transverse deformations of each of the beams originating on the one hand from said first longitudinal expansion-compression mode and on the other hand from said second bending mode, such that the effects of the over transverse deformation of the beam neutralize the effects of the transverse deformations of the bar in said zone.

Thus, for a bar of given length and slenderness ratio, the length and the slenderness ratio of the beams that make this neutralization possible each have a single value.

By way of illustration, if the first relationship is satisfied but the second is not, then the effects of the transverse deformations originating from said second bending mode are not adjusted to obtain the neutralization of the effects of the transverse deformations of the bar and of each of the beams in said zone, and the resonator does not function; such is the case in particular of the vibrating core drawn from the first approach and shown in FIGS. 1A" and 1A'": the length of the beams equal to that of the bar allows for the existence of said first longitudinal expansion-compression mode, but the slenderness ratio of the beams, close to five, is too far from that recommended by the second relationship (slenderness ratio necessarily greater than six and a half) to allow for the existence of said second bending mode.

Similarly, the resonator does not function if the second relationship is satisfied but the first is not, because in this case there is no vibrating of said first longitudinal expansion-compression mode of the beams.

When the two dimensional relationships are satisfied, said zone situated on the face of each of the beams opposite the face secured to the link element can he decoupled from the vibration of the bar and it is possible, by fixing the device on said zone, to obtain a real figure of merit of the bar that is close to its high intrinsic figure of merit. In order to obtain the maximum decoupling, the dimensioning of the resonator is optimized for example by means of numerical simulations based on the finite elements method.

Furthermore, the resonator can be produced at very low cost by exclusively open-ended collective machining of a planar plate of material of uniform thickness.

By contrast to the relatively complex configuration of the support portions (25) of the second approach shown in FIG. 2A (each support portion comprises an elastic part, an attenuation part and two connection parts), the mass configuration of the beams of the resonator according to the invention makes it possible for the correct operation of the resonator to be less demanding with regard to the production accuracy. Because of this, the resonator structure according to the invention is easier to produce, therefore more conducive to reducing the cost and the bulk of the resonator.

According to a second particular embodiment, the structure further comprises two fixing blocks positioned toward the outside of the structure and each linked to a beam by means of a link element positioned in the vicinity of said median plane, that is to say in said zone, which makes it possible for the fixing of said blocks onto a support not to affect the figure of merit of the resonator.

According to a third particular embodiment, the structure is made of quartz, the plane of the structure being parallel to the crystallographic plane XY and the longitudinal central axis of the bar being parallel to the crystallographic axis Y, and the structure is equipped with vibrating means that act by piezoelectric effect.

According to a fourth particular embodiment, the planar mechanical resonator structure according to the third embodiment is characterized in that the vibrating means comprise electrodes positioned on faces of the bar and of the beams and extending parallel to the longitudinal central axis.

According to a fifth particular embodiment, the planar mechanical resonator structure according to the fourth embodiment is characterized in that the structure is produced by chemical etching in sub-millimetric dimensions.

According to a sixth particular embodiment, the planar mechanical resonator structure according to the fourth embodiment is characterized in that the structure is produced by reactive etching in sub-millimetric dimensions.

The features and advantages of the invention will become more clearly apparent on reading the detailed description and the figures which relate there.

BRIEF DESCRIPTION OF THE DRAWINGS

FIG. 1A' is a perspective view of a vibrating core, the operation of which is drawn from that of the vibrating core of FIG. 1A and already described;

FIG. 1A" is a perspective view of another vibrating core, the operation of which is drawn from that of the vibrating core of FIG. 1A and already described;

FIG. 1A''' is intended to explain the operation of the vibrating core of FIG. 1A" and already described;

FIG. 2A' is a perspective view of another resonator according to the prior art and already described;

FIGS. 3A' and 3C' show front views of the vibrating core of another resonator according to the invention, for which the slenderness ratio of the bar is smaller than that illustrated in FIGS. 3A and 3C;

FIGS. 3A" and 3C" show front views of the vibrating core of another resonator according to the invention, for which the slenderness ratio of the bar is greater than that illustrated in FIGS. 3A and 3C.

DETAILED DESCRIPTION

Figure 3A:
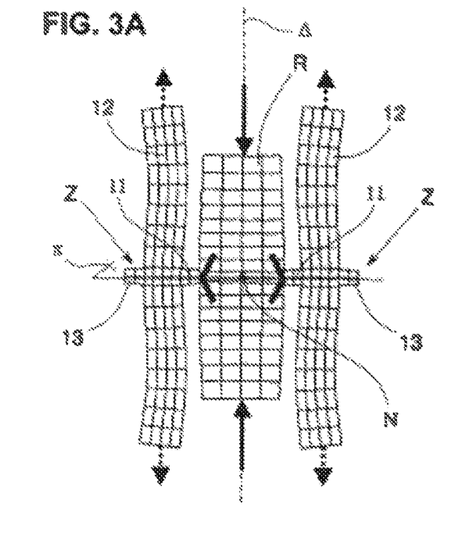
FIGS. 3A and 3B are intended to explain the operation of the vibrating core of a resonator according to the invention.
Figure 3B:
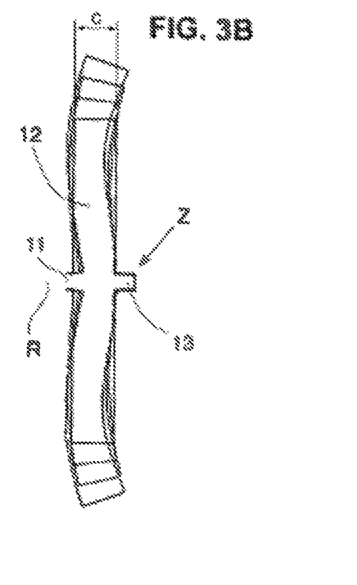
Figure 3C:
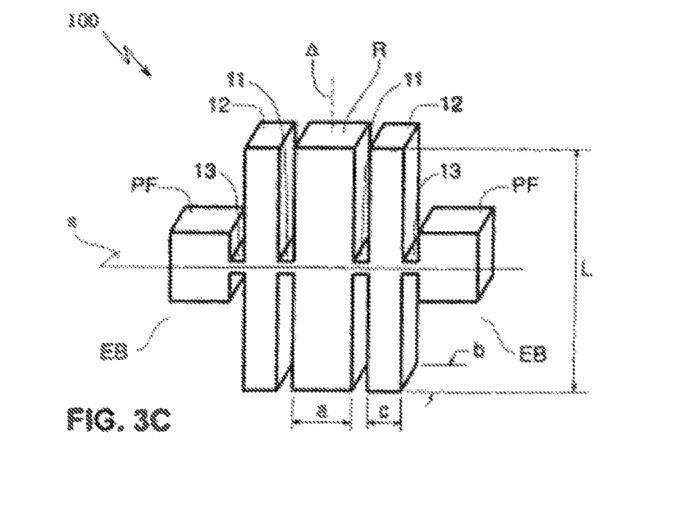
FIG. 3C is a perspective view of a resonator according to the invention.

Reference is made first to FIG. 3C which shows a perspective view of a resonator 100 according to the invention. The structure of the resonator 100 is monolithic and produced in a planar plate of material of uniform thickness b by means of an exclusively open-ended machining; the structure is therefore well suited to the microsystems integration techniques. The material is advantageously chosen for its very low viscous damping; it can, for example, be an isotropic material such as silica, or a crystalline material like quartz. The machining can be carried out for example by reactive ion etching or by chemical etching.

The resonator 100 comprises a parallelepipedal bar R whose longitudinal central axis $\Delta$ extends parallel to the plane of the plate and whose median plane $\pi$ at right angles to said longitudinal central axis $\Delta$ is therefore at right angles to the plane of the plate.

The dimensions of the bar R taken in the plane of the plate are its length L and its width a; the slenderness ratio of the bar R taken in the plane of the plate is therefore L/a. In the representation illustrated, said slenderness ratio of the bar is substantially equal to 4.

The resonator 100 also comprises two parallelepipedal beams 12 that are substantially identical to one another, each symmetrical relative to the median plane $\pi$ and positioned respectively on either side of the bar, the longitudinal axes of the beams being parallel to the longitudinal central axis $\Delta$, the length of the beams being substantially equal to the length L of the bar and their width c being such that the slenderness ratio L/c of the beams taken in the plane of the plate is substantially the result of the addition of 6.5 and a number equivalent to 28% of the slenderness ratio L/a of the bar; in this case, the slenderness ratio of the beams is substantially:

$$L/c = 6.5 + 0.28 \times 4 = 7.62$$

Regarding the thickness dimension b of the plate, the resonator according to the invention does not impose any specific recommendation. It is simply necessary to ensure that the thickness b is not too small (which could induce spurious vibration modes transversal to the plate) or too great (Poisson effects transversal to the plate could counter the correct operation of the resonator). In practice, the resonator according to the invention is well suited to a thickness b of the plate of the order of magnitude of the width c of the beams.

The resonator 100 also comprises two link elements 11 positioned respectively on either side of the bar in the vicinity of said median plane and each linking a machined face of the bar to a machined face of a beam.

The resonator 100 also comprises two fixing blocks PF positioned toward the outside of the resonator and each linked to a beam 12 by means of a link element 13 positioned in the vicinity of the median plane $\pi$. The fixing blocks PF are intended to be assembled on a package base EB (not represented).

The operation of the resonator according to the invention is now explained in relation to FIGS. 3A and 3B deriving from numerical simulations by finite elements and which illustrate the behavior of the vibrating core of the resonator 100.

It is important to stress that, for these numerical simulations, the vibrating core of the resonator is dissociated from the fixing blocks and that it is not fixed, that is to say that it is totally free to move (it is said that it is "held by the angels").

FIG. 3A shows exaggeratedly enlarged deformations of the bar R vibrating according to an expansion-compression resonance mode along its longitudinal central axis Δ and having a vibration node N in its median plane π, the vibration naturally inducing transverse expansion-compression deformations due to the Poisson's ratio of the material and indicated in the figure using V-shaped arrows, said transverse deformations being maximal in the median plane π and zero at the ends of the bar. It will be noted that the bar R shown in FIG. 3A and its longitudinal expansion-compression vibration naturally inducing transverse deformations are analogous to the solid straight cylinder R of the prior art shown in FIG. 1A and to its vibration.

Still referring to FIG. 3A, the beams 12 each vibrate simultaneously according to two modes, the first mode being a longitudinal expansion-compression mode in phase opposition with the vibration of the bar, the second mode being a bending mode (second partial) taking place parallel to the plane of the plate, the mechanical excitation of the beams taking place at the link elements 11.

It is important to stress that the simultaneous vibrations of the bar in longitudinal expansion-compression resonance mode and of the beams according to said first and second modes correspond to a particular mechanical resonance mode of the resonator according to the invention, for which the vibrating can be spontaneously obtained by exciting the bar in longitudinal expansion-compression resonance mode, for example by equipping the bar with vibrating means as will he explained hereinbelow.

The two dimensional relationships explained previously between the beams and the bar firstly allow for the coexistence of said first and second modes: the first relationship (length of the beams substantially equal to that of the bar) relates to the first mode and makes it possible to have the beams work substantially at their resonance frequency in longitudinal expansion-compression; in addition to the first relationship, the second relationship (slenderness ratio of the beams substantially equal to the result of the addition of six and a half and a number equivalent to twenty-eight percent of the slenderness ratio of the bar) relates to the second mode and makes it possible to have the beams work in the vicinity of their bending resonance frequency; in this case, in the case of the resonator shown in FIG. 3C for which the slenderness ratio of the bar is substantially equal to 4, the bending resonance frequency of the beams is approximately 10% higher than the frequency of the resonator.

Secondly, the two dimensional relationships condition the distribution of the transverse deformations of each of the beams originating on the one hand from said first longitudinal expansion-compression mode and on the other hand from said second bending mode, such that the effects of the overall transverse deformation of the beam neutralize the effects of the transverse deformations of the bar in a zone Z situated on the face of the beam opposite the face secured to the link element 11 and in the vicinity of the median plane π, as is explained hereinbelow in relation to FIG. 3B.

FIG. 3B shows the superposition of different states of the exaggeratedly enlarged deformation of a beam 12 during the half-period of the vibration of the resonator corresponding to the longitudinal compression of the bar.

It can be seen that the beam is deformed simultaneously in expansion (said first mode) and in bending (said second mode), and that its width dimension, initially c, undergoes an alternating variation during the vibration, said alternating variation being maximal in the vicinity of the median plane π and zero at the ends of the beam; said alternating variation results from the combination of two phenomena.

The first phenomenon is the transverse deformation of the beam (Poisson effect) linked to its longitudinal expansion.

The second phenomenon is the transverse deformation of the beam linked to its bending and to its mechanical excitation by the link element 11.

Still in FIG. 3B, it can also be seen that this is reflected by a displacement of the link element 11 in phase with the transverse expansion-compression deformation of the bar, and that the link element 13 situated in the zone Z undergoes practically no displacement during the vibration; this is due to the fact that the distribution of the transverse deformations of each of the beams originating on the one hand from said first mode and on the other hand from said second mode is such that the effects of the overall transverse deformation of the beam neutralize the effects of the transverse deformations of the bar in the zone Z, that is to say at the link element 13, which results from a dimensioning of the beam such that its length is substantially equal to that of the bar and that its slenderness ratio is substantially equal to the result of the addition of six and a half and of a number equivalent to twenty-eight percent of the slenderness ratio of the bar.

A person skilled in the art will understand that the explanation that has lust been given in reference to FIG. 3B for the half-period of the vibration of the resonator corresponding to the longitudinal compression of the bar is similar for the other half-period which corresponds to the longitudinal expansion of the bar, the only difference relating to the direction of the displacement of the link element 11.

In order to obtain, to the best possible extent, this spontaneous immobility of the link element 13 during the vibration of the vibrating core of the resonator, the dimensioning of the beam is optimized for example by means of numerical simulations by finite elements. Obviously, what has just been shown for a beam in relation to FIG. 3B is also valid for the other beam.

Thus, the link elements 13 situated in the zones Z can be completely decoupled from the vibration of the bar, and it is possible, by fixing the vibrating core of the resonator at the level of said link elements, for example by means of the fixing blocks PF shown in FIG. 3C, to obtain a real figure of merit of the bar that is close to its high intrinsic figure of merit.

The correct operation of the resonator according to the invention is less demanding on the production accuracy than the resonator according to the second approach illustrated in FIGS. 2A and 2B. This is due to the fact that, given equal resonator size, the support portions of the resonator according to the second approach include elements of relatively small dimensions (in particular the thicknesses W1 and W3 of the elastic part 30 and of the attenuation part 28), which is not the case of the massive beams of the resonator according to the invention.

Thus, the structure of the resonator according to the invention is better suited to reducing the bulk and the cost of the resonator.

With regard to the for of the beams 12 of the resonator according to the invention, a person skilled in the art will understand that the expression "parallelepipedal beam", as used here, is to be considered in the broad sense, the important thing being that the operation of the resonator is similar to that which has just been described. For example, the face contour of the beams, rectangular on the figures illustrating the invention, can have chamfers or rounded edges in place of sharp corners. This is not a drawback for the operation of the resonator according to the invention if care is taken to take these forms into account in the numerical simulations used to optimize the operation of the resonator.

The mechanical operation of the vibrating core of a resonator according to the invention, dimensioned for a bar of slenderness ratio L/a substantially equal to 4, has just been explained.

It will now be shown that the operation is similar for a vibrating core dimensioned for a bar of smaller slenderness ratio (FIGS. 3A' and 3C') or larger slenderness ratio (FIGS. 3A" and 3C").

FIG. 3C' shows a front view of the vibrating core of another resonator according to the invention, for which the slenderness ratio L/a of the bar R is substantially equal to 2.

The length of the beams 12 is substantially equal to the length L of the bar and their width c is such that the slenderness ratio L/c of the beams is substantially the result of the addition of 6.5 and of a number equivalent to 28% of the slenderness ratio L/a of the bar; in this case, the slenderness ratio of the beams is substantially:

$$L/c=6.5+0.28\times 2=7.06$$

In FIG. 3A' which shows exaggeratedly enlarged deformations of this vibrating core, it can be seen that the beams 12 each vibrate simultaneously according to said first and second modes, and the results of the numerical simulations by finite elements indicate that the link elements 13 undergo practically no displacement during the vibration.

FIG. 3C" shows a front view of the vibrating core of another resonator according to the invention, for which the slenderness ratio L/a of the bar R is substantially equal to 10.

The length of the beams 12 is substantially equal to the length L of the bar and their width c is such that the slenderness ratio L/c of the beams is substantially the result of the addition of 6.5 and of a number equivalent to 28% of the slenderness ratio L/a of the bar; in this case, the slenderness ratio of the beams is substantially:

$$L/c=6.5+0.28\times 10=9.3$$

In FIG. 3A" which shows exaggeratedly enlarged deformations of this vibrating core, it can be seen that the beams 12 each vibrate simultaneously according to said first and second modes, and the results of the numerical simulations by finite elements indicate that the link elements 13 undergo practically no displacement during the vibration.

Generally, the resonator according to the invention is suited to any bar slenderness ratio.

It is interesting to note that, for very different bar slenderness ratios, such as the slenderness ratio of value 2 shown in FIG. 3C' and the slenderness ratio of value 10 shown in FIG. 3C", the slenderness ratios of the beams are of relatively close values, respectively 7.06 and 9.3.

This is due to the fact that said second bending mode of the beams of the resonator according the invention is excited in the vicinity of its resonance, the excitation frequency be that of the expansion-compression resonance vibration of the bar.

Now, for a given material, the expansion-compression resonance frequency of the bar is substantially proportional to the quantity 1/L, and the bending resonance frequency of the beams is substantially proportional to the quantity $c/L^2$.

Thus, since these two frequencies are close, the ratio of said quantities is close to a constant:

$$(1/L)/(c/L^2)=L/c=\text{slenderness ratio of the beams}\approx \text{constant}$$

As explained previously, the resonator according to the invention is well suited to miniaturization.

By way of example, it is possible to produce a quartz resonator of overall dimensions 500 µm×500 µm×50 µm whose frequency is of the order of 5 MHz and whose figure of merit is greater than $10^6$.

Figure 4A:
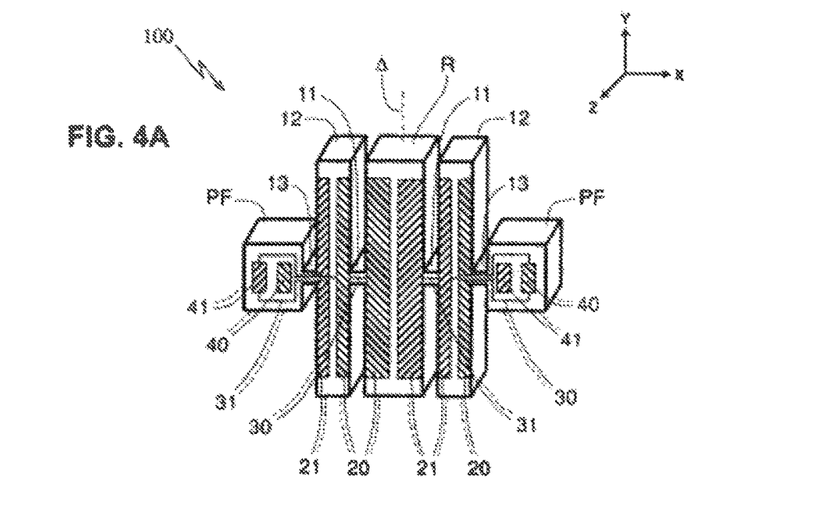
FIGS. 4A and 4B show electrodes allowing for the excitation by piezoelectric effect of the vibration of the resonator of FIG. 3C in the case where the latter is made of quartz.
Figure 4B:
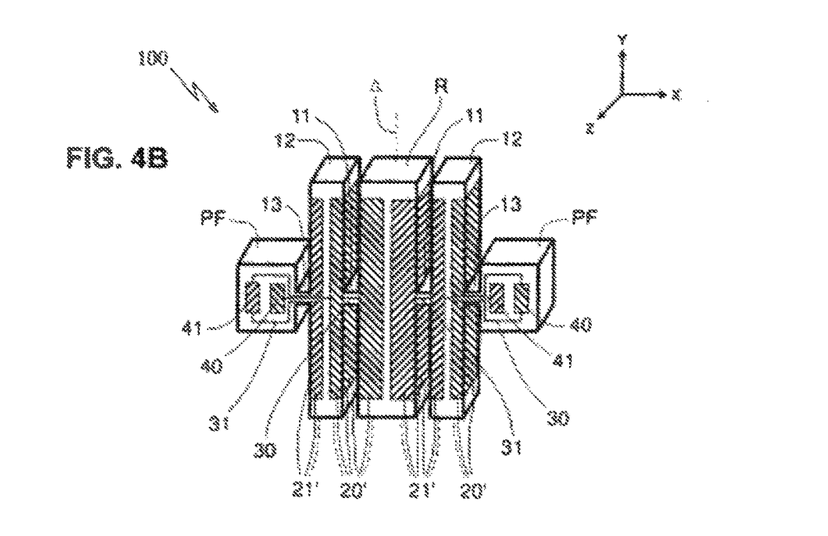

Means for vibrating the resonator in the case where the latter is made of quartz in which the orientation of the crystallographic axes X, Y, Z is indicated in the figures, will now be presented with reference to FIGS. 4A and 4B.

FIG. 4A shows the resonator 100 of FIG. 3C of which the bar R is equipped with electrodes 20 and 21 acting by piezoelectric effect. The electrodes 20 and 21 are positioned on each of the two faces of the bar R flush with the large faces of the plate, and are in the form of strips extending parallel to the longitudinal axis Δ which is also the crystallographic axis Y of the quartz.

FIG. 4A shows the electrodes 20 and 21 on one of said faces of the bar; the electrodes 20 and 21 on the other face, indicated using a dotted reference line, are respectively positioned opposite.

The electrodes 20 and 21 are able to create, in the bar, an electrical field of which the component $E_x$ at right angles to the longitudinal axis Δ and parallel to the large faces of the plate, is coupled by piezoelectric effect to the mechanical expansion or compression strain $T_{YY}$ occurring predominantly in the expansion-compression vibration of the bar R. Thus, the electrodes 20 and 21 are effective means for vibrating the bar R.

Still in relation to FIG. 4A, the beams 12 of the resonator 100 are, for their part, also equipped with electrodes acting by piezoelectric effect and also, for their part, referenced 20 and 21 to reflect the identity of the polarities with the electrodes of the bar R.

As can be seen in the figure, the positioning of the electrodes of the beams 12 makes it possible to create, in the beams, an electrical field of which the component $E_x$ is opposite to that of the bar. In this way, the electrodes 20 and 21 are able to excite, in the beams, a longitudinal expansion-compression vibration in phase opposition with the longitudinal expansion-compression vibration of the bar.

It is important to note that the electrodes 20 and 21 with which the beams are equipped are not necessary to the operation of the resonator according to the invention, because the vibrating of the bar is sufficient, mechanically, to vibrate the beams in phase opposition as explained previously. Nevertheless, the electrodes 20 and 21 with which the beams are equipped are interesting because they make it possible to improve the piezoelectric coupling of the resonator.

The electrodes 20 and 21 are linked to electrical connection lands respectively 40 and 41 positioned on the fixing blocks PF, by means of connecting strips respectively 30 and 31 running on the link elements 11 and 13, the beams 12 and the fixing blocks PF.

FIG. 4B shows the resonator 100 equipped with electrodes 20' and 21' that are more complete than the electrodes 20 and 21 of FIG. 4A. The electrodes 20' and 21' comprise, in addition to the strips positioned on the faces of the bar and of the beams flush with the two large faces of the plate, other strips positioned on the machined faces of the bar and of the beams and produced, for example, by metal evaporation in oblique directions relative to the main axes of the resonator, each of said the strips being in electrical contact with the strip of a large face flush with the common edge.

Thus, the component $E_x$ of the electrical field can be more intense, and the effectiveness of the electrodes 20' and 21' greater than that of the electrodes 20 and 21, involving, however, an extra production cost.

Furthermore, the electrical link between the strips of the two large faces being ensured by said other strips, it is no longer necessary to have the connecting strips 30 and 31 and the connection lands 40 and 41 on the two large faces of the resonator.

The invention claimed is:

1. A planar mechanical resonator structure comprising a bar (R) vibrating according to an expansion-compression mode along its longitudinal central axis (Δ) and having a vibration node (N) in its median plane (π) at right angles to said longitudinal central axis, the vibration naturally inducing transverse expansion-compression deformations, characterized in that the structure comprises two parallelepipedal beams that are substantially identical to one another, each symmetrical relative to said median plane (π) and positioned respectively on either side of the bar (R), the longitudinal axes of the beams being parallel to said longitudinal central axis (Δ), the length of the beams being substantially equal to the length (L) of the bar and the slenderness ratio (L/c) of the beams taken in the plane of the structure being substantially equal to the result of the addition of six and a half and a number equivalent to twenty eight percent of the slenderness ratio (L/a) of the bar taken in the plane of the structure, and two link elements positioned respectively on either side of the bar in the vicinity of said median plane and each linking a face of the bar to a face of a beam, by virtue of which the beams, excited at the link elements by said transverse expansion-compression deformations of the bar, each vibrate simultaneously according to two modes, the first mode being a longitudinal expansion-compression mode in phase opposition with the vibration of the bar, the second mode being a bending mode taking place parallel to the plane of the structure, and the effects of the transverse deformations of the bar and of each of the beams are neutralized in a zone (Z) situated on the face of the beam opposite the face secured to the link element and in the vicinity of said median plane (π).

2. The planar mechanical resonator structure as claimed in claim 1, characterized in that the structure further comprises two fixing blocks (PF) positioned toward the outside of the structure and each linked to a beam by means of a link element positioned in the vicinity of the median plane (π).

3. The planar mechanical resonator structure as claimed in claim 1, characterized in that the structure is made of quartz, the plane of the structure being parallel to the crystallographic plane XY and the longitudinal central axis (Δ) of the bar being parallel to the crystallographic axis Y, and that the structure is equipped with vibrating means that act by piezoelectric effect.

4. The planar mechanical resonator structure as claimed in claim 3, characterized in that the vibrating means comprise electrodes positioned on faces of the bar and of the beams and extending parallel to the longitudinal central axis (Δ).

5. The planar mechanical resonator structure as claimed in claim 4, characterized in that the structure is produced by chemical etching in sub-millimetric dimensions.

6. The planar mechanical resonator structure as claimed in claim 4, characterized in that the structure is produced by reactive ion etching in sub-millimetric dimensions.

* * * * *